(12) United States Patent
Oka

(10) Patent No.: US 11,621,177 B2
(45) Date of Patent: Apr. 4, 2023

(54) PLASMA PROCESSING APPARATUS AND CALCULATION METHOD

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 302 days.

(21) Appl. No.: 16/872,713

(22) Filed: May 12, 2020

(65) Prior Publication Data

US 2020/0365427 A1 Nov. 19, 2020

(30) Foreign Application Priority Data

May 13, 2019 (JP) .............................. JP2019-090848

(51) Int. Cl.
| | |
|---|---|
| H01L 21/67 | (2006.01) |
| H01J 37/32 | (2006.01) |
| G05D 23/19 | (2006.01) |
| H01L 21/683 | (2006.01) |
| H01L 21/3065 | (2006.01) |
| H05B 1/02 | (2006.01) |

(52) U.S. Cl.
CPC ....... *H01L 21/67103* (2013.01); *G05D 23/19* (2013.01); *G05D 23/193* (2013.01); *H01J 37/32532* (2013.01); *H01J 37/32724* (2013.01); *H01J 37/32926* (2013.01); *H01J 37/32935* (2013.01); *H01L 21/3065* (2013.01); *H01L 21/67248* (2013.01); *H01L 21/683* (2013.01); *H05B 1/0233* (2013.01)

(58) Field of Classification Search
CPC .......... H01J 37/32935; H01J 37/32724; H01J 37/32926; H01J 37/32532; H01L 21/3065; H01L 21/683; H01L 21/6831; H01L 21/67103; H01L 21/67109; H01L 21/67248; H05B 1/0233; G05D 23/193; G05D 23/19; G05D 23/1917
See application file for complete search history.

(56) References Cited

U.S. PATENT DOCUMENTS 10,170,284 B2   1/2019 Yasuda et al.

FOREIGN PATENT DOCUMENTS

JP           2015-201558 A        11/2015

*Primary Examiner* — Yuechuan Yu
(74) *Attorney, Agent, or Firm* — Weihrouch IP

(57) ABSTRACT

A plasma processing apparatus includes a measurement unit that, while controlling a supply power to a heater such that a temperature of the heater becomes constant, measures the supply power to the heater in a non-ignition state where a plasma is not ignited and in a transient state where the supply power to the heater is reduced after the plasma is ignited. The plasma processing apparatus also includes a parameter calculator that calculates a thickness of a top plate by performing a fitting on a calculation model which includes the thickness of the top plate as a parameter and calculates the supply power in the transient state, using the measured supply power in the non-ignition state and the transition state.

9 Claims, 10 Drawing Sheets

PLASMA PROCESSING APPARATUS AND CALCULATION METHOD

CROSS-REFERENCE TO RELATED APPLICATION

This application is based on and claims priority from Japanese Patent Application No. 2019-090848 filed on May 13, 2019 with the Japan Patent Office, the disclosure of which is incorporated herein in its entirety by reference.

TECHNICAL FIELD

The present disclosure relates to a plasma processing apparatus, a calculation method, and a calculation program.

BACKGROUND

Japanese Patent Laid-Open Publication No. 2015-201558 proposes a technique in which an annular coil is disposed at an upper portion of a chamber and a current is applied to the coil to generate a magnetic field, thereby flattening an interface between a semiconductor wafer and a plasma sheath formed above a focus ring.

SUMMARY

A plasma processing apparatus according to an embodiment of the present disclosure includes a support, a heater controller, a measurement unit, and a parameter calculator. The support is configured to detachably support a top plate that faces a plasma and provided with a heater capable of adjusting the temperature of a support surface of the top plate. The heater controller is configured to control a supply power to the heater such that the heater has a set temperature. The measurement unit is configured to, while controlling the supply power to the heater by the heater controller such that a temperature of the heater becomes constant, measure a supply power in a non-ignition state where the plasma is not ignited and in a transient state where the supply power to the heater is reduced after the plasma is ignited. The parameter calculator is configured to calculate a thickness of the top plate by performing a fitting on a calculation model which includes the thickness of the top plate as a parameter and calculates the supply power in the transient state using the supply power in the non-ignition state and the transient state measured by the measurement unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a plasma processing apparatus, a calculation method, and a calculation program disclosed herein will be described in detail with reference to the drawings. In the present disclosure, an apparatus that performs a plasma etching will be described in detail as a specific example of the plasma processing apparatus. In addition, the present embodiments are not limited to the plasma processing apparatus, calculation method, and calculation program disclosed herein. Respective embodiments may be appropriately combined within a range that does not contradict the processing contents.

A plasma processing apparatus has been known which performs an etching processing on a semiconductor wafer (hereinafter, referred to as a "wafer") using plasma. For example, in a capacitively-coupled parallel plate plasma processing apparatus, an etching is performed by generating a plasma between a stage on which a wafer is placed and a top plate disposed above the stage. In the plasma processing apparatus, a distance between the stage and the top plate is one of important factors regarding etching characteristics and uniformity.

When the plasma processing apparatus performs a plasma processing, the surface of the top plate exposed to the plasma is consumed by radicals and ions in the plasma. In the plasma processing apparatus, when the distance between the stage and the top plate increases due to consumption of the top plate, there is a possibility that etching characteristics and uniformity may fluctuate. For this reason, in the plasma processing apparatus of the related art, the top plate replacement time is determined based on the execution time of the plasma processing and the number of processed wafers.

However, the plasma processing apparatus may perform processing with a different process recipe. For this reason, since the plasma processing apparatus needs to use a replacement time with a certain margin in the past results, the productivity of the plasma processing apparatus decreases.

Therefore, in the plasma processing apparatus, a technology of determining a degree of consumption of the top plate consumed by the plasma processing is expected.

First Embodiment

[Configuration of Plasma Processing Apparatus]

Figure 1:
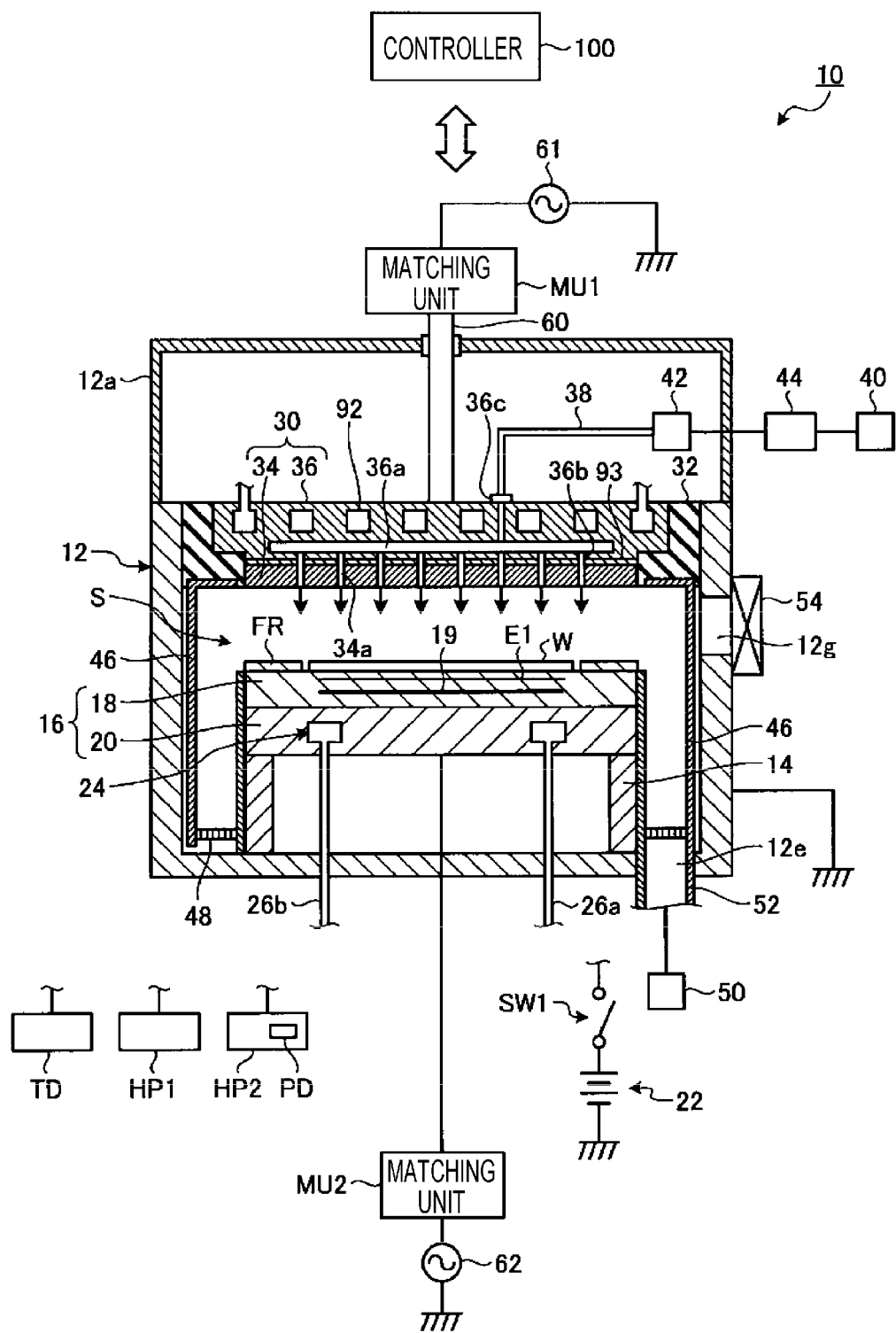
FIG. 1 is a cross-sectional view illustrating an example of a schematic configuration of a plasma processing apparatus according to a first embodiment.

First, the configuration of the plasma processing apparatus 10 according to an embodiment will be described. FIG. 1 is a cross-sectional view illustrating an example of a schematic configuration of a plasma processing apparatus according to a first embodiment. The plasma processing apparatus 10 illustrated in FIG. 1 is a capacitively coupled parallel plate plasma processing apparatus. The plasma processing apparatus 10 includes a substantially cylindrical processing container 12. The processing container 12 is made of, for example, aluminum. Further, the surface of the processing container 12 is anodized.

A stage 16 is provided within the processing container 12. The stage 16 includes an electrostatic chuck 18 and a base 20. The upper surface of the electrostatic chuck 18 is a placing surface on which a workpiece to be subjected to a plasma processing is placed. In the present embodiment, a wafer W is placed on the upper surface of the electrostatic chuck 18 as a workpiece. The base 20 has a substantially disc shape and the main portion thereof is made of a conductive metal such as, for example, aluminum. The base 20 constitutes a lower electrode. The base 20 is supported by a support 14. The support 14 is a cylindrical member that extends from the bottom of the processing container 12.

An electrostatic chuck 18 is provided on the base 20. The electrostatic chuck 18 adsorbs the wafer W by an electrostatic force such as a coulomb force to hold the wafer W. The electrostatic chuck 18 is provided with an electrode E1 for electrostatic adsorption in a ceramic main body. A DC power supply 22 is electrically connected to the electrode E1 through a switch SW1. The adsorption force that holds the wafer W depends on the value of the DC voltage applied from the DC power supply 22.

In the stage 16, a focus ring FR is disposed around the wafer W on the electrostatic chuck 18. The focus ring FR is provided to enhance the uniformity of the plasma processing. The focus ring FR is made of a material that is appropriately selected according to the plasma processing to be performed. For example, the focus ring FR is made of silicon or quartz.

In the electrostatic chuck 18, a heater 19 is provided below the electrode E1. The heater 19 is connected to a first heater power supply HP1 via a wiring (not illustrated). The first heater power supply HP1 supplies the adjusted power to the heater 19 under the control of a controller 100. Thus, the heat generated by the heater 19 is controlled, and the temperature of the wafer W placed on the electrostatic chuck 18 is adjusted. In addition, the heater 19 may be individually provided for each of the divided regions obtained by dividing the placing surface of the electrostatic chuck 18 on which the wafer W is placed, so that the temperature may be individually adjusted for each of the divided regions. Further, a heat transfer gas, for example, He gas may be supplied between the upper surface of the electrostatic chuck 18 and the back surface of the wafer W by a heat transfer gas supply mechanism and a gas supply line (not illustrated).

A coolant flow path 24 is formed inside the base 20. The coolant flow path 24 is supplied with a coolant from a chiller unit provided outside the processing container 12, through a pipe 26a. The coolant supplied to the coolant flow path 24 returns to the chiller unit through a pipe 26b.

A shower head 30 is provided in the processing container 12. The shower head 30 is disposed above the stage 16 to face the stage 16. The stage 16 and the shower head 30 are provided substantially parallel to each other.

The shower head 30 is supported on the upper portion of the processing container 12 via an insulating shielding member 32. The shower head 30 includes a top plate 34 arranged to face the stage 16 and a support 36 that supports the top plate 34.

The top plate 34 is arranged to face the stage 16 and has a plurality of gas holes 34a that eject a processing gas into the processing container 12. The top plate 34 is formed of, for example, silicon or SiC.

The support 36 is made of a conductive material, for example, aluminum whose surface is anodized, and is configured to be able to detachably support the top plate 34 in the lower portion.

A gas diffusion chamber 36a is formed inside the support 36 to supply a processing gas to the plurality of gas holes 34a. A plurality of gas flow holes 36b is formed at the bottom of the support 36 to be located below the gas diffusion chamber 36a. The plurality of gas flow holes 36b communicate with the plurality of gas holes 34a, respectively.

The support 36 has a gas inlet 36c that introduces a processing gas into the gas diffusion chamber 36a. A gas supply pipe 38 is connected to the gas inlet 36c.

A gas source group 40 is connected to the gas supply pipe 38 via a valve group 42 and a flow rate controller group 44. The valve group 42 has a plurality of opening/closing valves. The flow rate controller group 44 has a plurality of flow rate controllers such as a mass flow controller. Further, the gas source group 40 includes a plurality of types of gas sources required for the plasma processing. The plurality of gas sources of the gas source group 40 are connected to the gas supply pipe 38 via a corresponding opening/closing valve and a corresponding mass flow controller.

In the plasma processing apparatus 10, one or more gases from one or more gas sources selected among a plurality of gas sources of the gas source group 40 are supplied to the gas supply pipe 38. The gas supplied to the gas supply pipe 38 reaches the gas diffusion chamber 36a and is discharged to a processing space S through the gas flow holes 36b and the gas discharge holes 34a.

The shower head 30 is provided with a temperature control mechanism that adjusts the temperature of the top plate 34. For example, a coolant flow path 92 is formed inside the base 36. The coolant flow path 92 is connected to a chiller unit provided outside the processing container 12 via a pipe, and the coolant is circulated and supplied. That is, the shower head 30 constitutes a coolant circulation system that includes a coolant flow path 92, a pipe, and a chiller unit as a temperature control mechanism. The chiller unit is configured to be able to control the temperature or flow rate of the coolant supplied to the coolant flow path 92 by receiving a control signal from the controller 100 (to be described later). The controller 100 controls the temperature of the top plate 34 by controlling the temperature or flow rate of the coolant supplied from the chiller unit to the coolant flow path 92.

In the shower head 30, a heater 93 is provided inside the top plate 34 side of the gas diffusion chamber 36a of the support 36. The heater 93 is provided in a region corresponding to an arrangement region of the top plate 34 and heats the top plate 34. The heater 93 is connected to a second heater power supply HP2 via a wiring (not illustrated). The second heater power supply HP2 supplies the adjusted power to the heater 93 under the control of a controller 100. Thus, the heat generated by the heater 93 is controlled, and the temperature of the top plate 34 is individually adjusted.

The second heater power supply HP2 is provided with a power detector PD that detects the supply power supplied to the heater 93. In addition, the power detector PD may be provided separately from the second heater power supply HP2 on a wire through which electric power flows from the second heater power supply HP2 to the heater 93. The power detector PD detects the supply power supplied to the heater 93. For example, the power detector PD detects a power amount [W] as the supply power supplied to the heater 93. The heater 93 generates heat according to the amount of electric power. Therefore, the amount of electric power supplied to the heater 93 indicates the heater power. The power detector PD notifies the controller 100 of power data indicating the detected supply power to the heater 93.

Further, the shower head 30 is provided with a temperature sensor (not illustrated) capable of detecting the temperature of the heater 93. The temperature sensor may be an element that measures a temperature separately from the heater 93. Further, the temperature sensor may be an element that is disposed on a wiring through which electric power flows to the heater 93 and detects a temperature by utilizing a property of increasing electric resistance according to a temperature rise. A sensor value detected by the temperature sensor is sent to a temperature measuring device TD. The temperature measuring device TD measures the temperature of the region where the heater 93 is arranged from the sensor value. The temperature measuring device TD notifies the controller 100 of temperature data indicating the temperature of the region where the heater 93 is arranged.

A first radio-frequency power supply 61 is electrically connected to the shower head 30 as an upper electrode via a low-pass filter (LPF), a matching unit MU1, and a power supply rod 60 (not illustrated). The first radio-frequency power supply 61 is a power supply for generating a plasma and supplies an RF power having a frequency of 13.56 MHz or more, for example, 60 MHz, to the shower head 30. The matching unit MU1 matches a load impedance with the internal (or output) impedance of the first radio-frequency power supply 61. The matching unit MU1 functions so that the output impedance and the load impedance of the first radio-frequency power supply 61 apparently match when a plasma is generated in the processing container 12. An output terminal of the matching unit MU1 is connected to an upper end of the power supply rod 60.

A second radio-frequency power supply 62 is electrically connected to the stage 16 as an upper electrode via a low-pass filter (LPF) and a matching unit MU2 (not illustrated). The second radio-frequency power supply 62 is a power supply for attracting ions (for bias) and supplies an RF power of a frequency within a range of 300 kHz to 13.56 MHz, for example, 2 MHz, to the stage 16. The matching unit MU2 matches the load impedance with the internal (or output) impedance of the second radio-frequency power supply 62. The matching unit MU2 functions so that the output impedance and the load impedance of the second radio-frequency power supply 62 apparently match when a plasma is generated in the processing container 12.

The plasma processing apparatus 10 further includes a grounding conductor 12a. The grounding conductor 12a is a substantially cylindrical grounding conductor and is provided to extend above the height of the upper electrode 30 from the side wall of the processing container 12.

Further, in the plasma processing apparatus 10, a deposit shield 46 is detachably provided along the inner wall of the processing container 12. The deposit shield 46 is also provided in the outer periphery of the support 14. The deposit shield 46 suppresses any etching byproduct (deposit) from being attached to the processing container 12, and is formed by coating a ceramic such as $Y_2O_3$ on an aluminum material. The temperature of the deposit shield 46 is configured to be controllable. For example, the deposit shield 46 is provided with a heater (not illustrated) so that the temperature may be controlled.

An exhaust plate 48 is provided at the bottom of the processing container 12 between the support 14 and the inner wall of the processing container 12. The exhaust plate 48 is formed by coating a ceramic such as $Y_2O_3$ on an aluminum material. The processing container 12 is provided with an exhaust port 12e below the exhaust plate 48. The exhaust port 12e is connected to an exhaust device 50 via an exhaust pipe 52. The exhaust device 50 includes a vacuum pump such as, for example, a turbo molecular pump. When performing the plasma processing, the exhaust device 50 reduces the pressure inside the processing container 12 to a desired degree of vacuum. In addition, a loading/unloading port 12g for the wafer W is provided on the side wall of the processing container 12. The loading/unloading port 12g may be opened and closed by a gate valve 54.

The operation of the plasma processing apparatus 10 configured as described above is totally controlled by the controller 100. The controller 100 is, for example, a computer, and controls respective parts of the plasma processing apparatus 10. The operation of the plasma processing apparatus 10 is totally controlled by the controller 100.

[Configuration of Controller]

Figure 2:
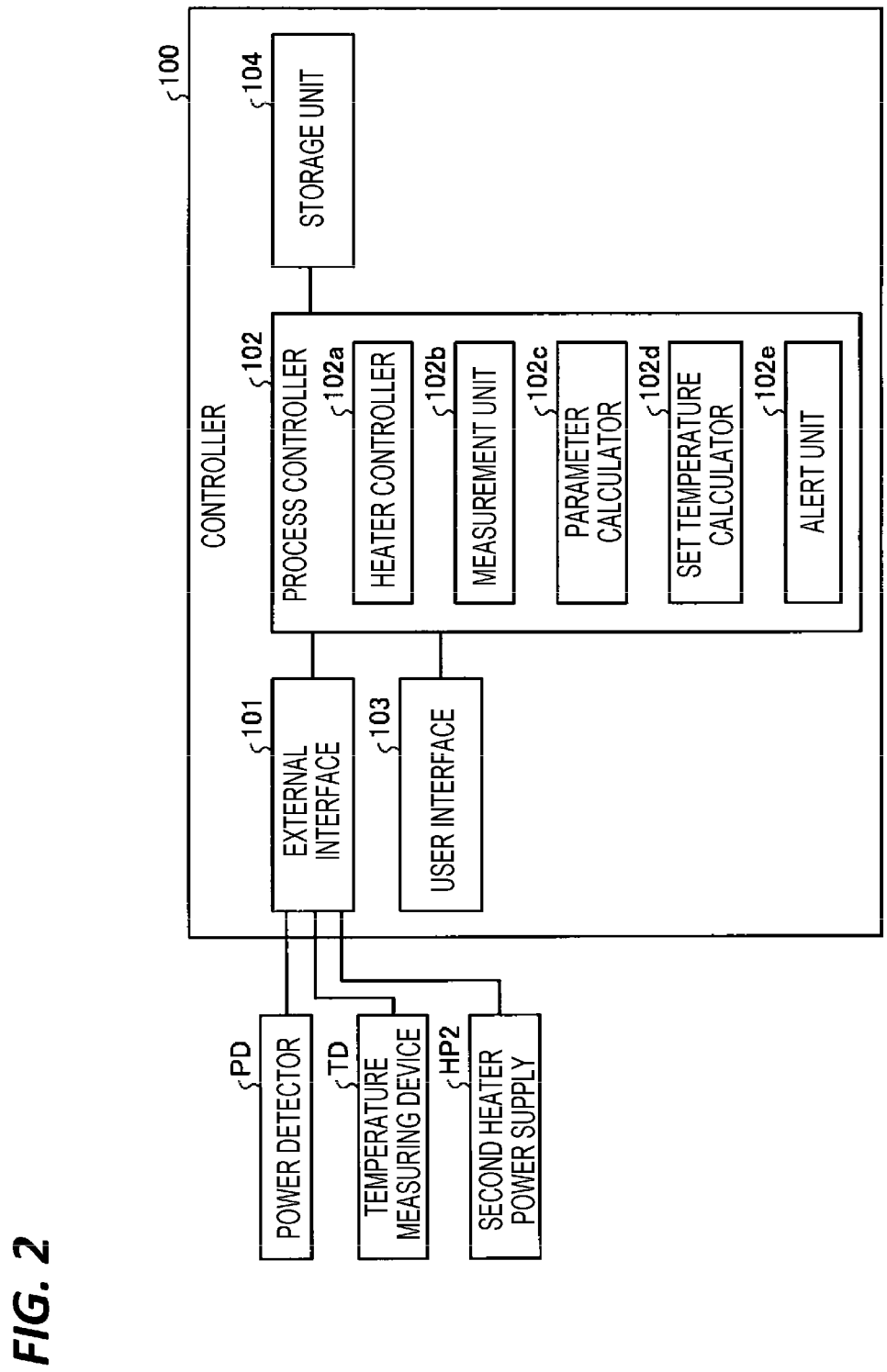
FIG. 2 is a block diagram illustrating a schematic configuration of a controller that controls the plasma processing apparatus according to the first embodiment.

Next, the controller 100 will be described in detail. FIG. 2 is a block diagram illustrating a schematic configuration of the controller 100 that controls the plasma processing apparatus according to the first embodiment. The controller 100 is, for example, a computer, and includes an external interface 101, a process controller 102, a user interface 103, and a storage unit 104.

The external interface 101 may communicate with the respective parts of the plasma processing apparatus 10, and inputs and outputs various types of data. For example, power data indicating the supply power from the power detector PD to the heater 93 is input to the external interface 101. Further, temperature data indicating the temperature of the region where the heater 93 is arranged is input to the external interface 101. Also, the external interface 101 outputs control data for controlling the supply power to the heater 93 to the second heater power supply HP2.

The process controller 102 includes a central processing unit (CPU) and controls the respective parts of the plasma processing apparatus 10.

The user interface 103 includes a keyboard that allows a process manager to input commands for managing the plasma processing apparatus 10, and a display that visualizes and displays the operation status of the plasma processing apparatus 10.

The storage unit 104 stores control programs (software) that implement various processes executed by the plasma processing apparatus 10 under the control of the process controller 102. Further, the storage unit 104 stores a recipe in which processing condition data is stored, and parameters regarding an apparatus and a process for performing the plasma processing. The storage unit 104 also stores parameters regarding an apparatus and a process for performing the plasma processing. In addition, the control programs, the recipes, and the parameters may be stored in a computer-readable recording medium (e.g., a hard disk, an optical disk such as a DVD, a flexible disk, or a semiconductor memory). The control programs, the recipes, and the parameters may also be stored in another device, and may be read and used online, for example, via a dedicated line.

The process controller 102 has an internal memory that stores programs and data, reads the control program stored in the storage unit 104, and executes a processing of the read control program. The process controller 102 functions as various processing units by the operation of the control program. For example, the process controller 102 has functions of a heater controller 102a, a measurement unit 102b, a parameter calculator 102c, a set temperature calculator 102d, and an alert unit 102e. In the present embodiment, a case where the process controller 102 functions as various processing units has been described as an example, but the present disclosure is not limited thereto. For example, the functions of the heater controller 102a, the measurement unit 102b, the parameter calculator 102c, the set temperature calculator 102d, and the alert unit 102e may be implemented in a distributed manner by a plurality of controllers.

In the plasma processing, the progress of the processing changes depending on the temperature. For example, in a plasma etching, the progress speed of the etching changes depending on the temperature of the top plate 34. Therefore, in the plasma processing apparatus 10, the temperature of the top plate 34 may be controlled to a target temperature by the heater 93.

Figure 3:
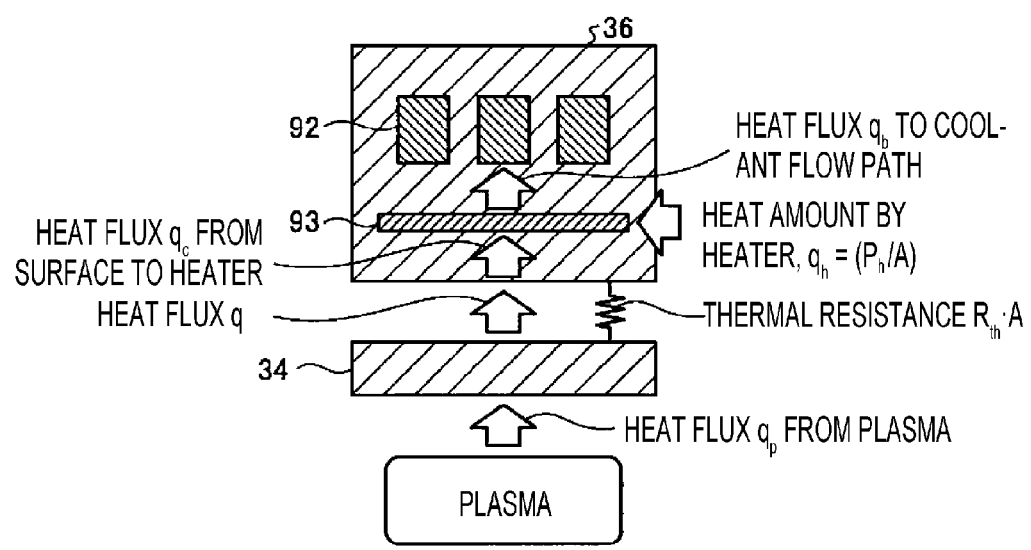
FIG. 3 is a diagram schematically illustrating a flow of energy affecting the temperature of a top plate.

Here, descriptions will be made on a flow of energy that affects the temperature of the top plate 34. FIG. 3 is a diagram schematically illustrating a flow of energy affecting the temperature of the top plate. FIG. 3 illustrates the shower head 30 including the top plate 34 and the support 36 in a simplified manner. The heater 93 is provided inside the support 36. Further, a coolant flow path 92 through which a coolant flows is formed above the heater 93 inside the support 36.

The heater 93 generates heat according to the supply power supplied from the second heater power supply HP2, and the temperature rises. In FIG. 3, the supply power supplied to the heater 93 is indicated as a heater power $P_h$. The heater 93 generates an amount of heat generated (heat flux) $q_h$ per unit area obtained by dividing the heater power $P_h$ by the area A of a region of the support 36 where the heater 93 is provided.

When the plasma processing is performed, heat is input to the top plate 34 from the plasma. FIG. 3 illustrates a heat flux $q_p$ from the plasma per unit area obtained by dividing the amount of heat input from the plasma to the top plate 34 by the area of the top plate 34. The temperature of the top plate 34 rises due to the heat input of the heat flux $q_p$ and the heat input of the radiant heat qr from the plasma.

The heat transmitted to the top plate 34 is transmitted to the support 36. Here, not all heat of the top plate 34 is transmitted to the support 36, but heat is transmitted to the support 36 in accordance with the difficulty in transmitting heat, such as the degree of contact between the top plate 34 and the support 36. The difficulty in transmitting heat, that is, the thermal resistance, is inversely proportional to the cross-sectional area with respect to the direction of heat transmission. For this reason, FIG. 3 illustrates the difficulty in transmitting heat from the top plate 34 to the surface of the support 36 as a thermal resistance $R_{th} \cdot A$ per unit area between the top plate 34 and the support surface of the support 36 that supports the top plate 34. Further, the symbol "A" indicates the area of the region where the heater 93 is provided. The symbol "$R_{th}$" indicates the thermal resistance in the entire region where the heater 93 is provided. In FIG. 3, the amount of heat input from the top plate 34 to the surface of the support 36 is illustrated as a heat flux q per unit area from the top plate 34 to the surface of the support 36. The thermal resistance $R_{th} \cdot A$ depends on the surface condition of the support 36 and device parameters related to thermal resistance or thermal conductivity.

The heat transmitted to the surface of the support 36 raises the temperature of the support 36 and is further transmitted to the heater 93. In FIG. 3, the amount of heat input from the surface of the support 36 to the heater 93 is indicated as a heat flux qc per unit area from the surface of the support 36 to the heater 93.

Meanwhile, the support 36 is cooled by the coolant flowing through the coolant flow path 92. At this time, in FIG. 3, the amount of heat removed from the support 36 to the coolant flow path 92 is indicated as a heat flux qb per unit area to the support 36. As a result, the heater 93 is cooled by the heat removal, and the temperature thereof decreases.

The surface of the top plate 34 exposed to the plasma is consumed by radicals and ions in the plasma, and the thickness thereof is reduced. In the plasma processing apparatus 10, when the top plate 34 is consumed and the thickness thereof becomes thinner, the amount of heat input to the heater 93 during the plasma processing changes.

Figure 4:
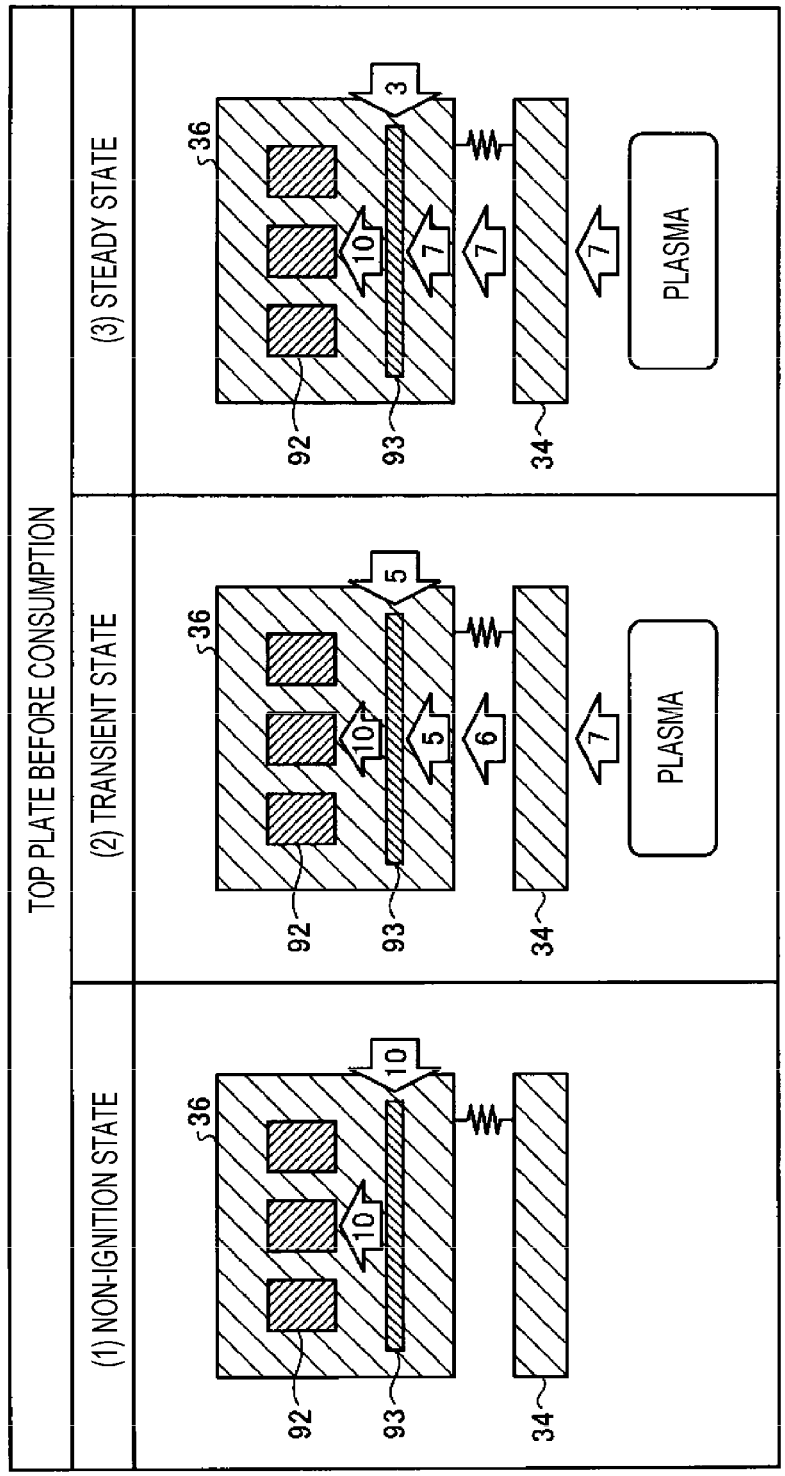
FIG. 4 is a diagram schematically illustrating a flow of energy of a top plate before consumption.

Here, descriptions will be made on the change in the amount of heat input to the heater 93 due to consumption of the top plate 34. FIG. 4 is a diagram schematically illustrating a flow of energy of the top plate before consumption.

When the temperature of the heater 93 is controlled to be constant, in the position of the heater 93, a sum of the amount of heat input to the heater 93 and the amount of heat generated by the heater 93 becomes equal to the amount of heat removed from the heater 93. FIG. 4 is a diagram schematically illustrating a flow of energy of the top plate 34. For example, in the non-ignition state where a plasma is not ignited, the total amount of heat generated by the heater 93 is equal to the amount of heat removed from the heater 93. In FIG. 4, in the example of the "non-ignition state," a heat amount of "10" is removed from the heater 93 by cooling from the coolant flow path 92. When the temperature of the heater 93 is controlled to be constant, the heater 93 generates a heat amount of "10" from the second heater power supply HP2 by the heater power $P_h$.

For example, in the ignition state where the plasma is ignited, the heater 93 also receives heat from the plasma via the support 36. The ignition state includes a transient state and a steady state. The transient state is, for example, a state where the amount of heat input to the top plate 34 or the support 36 is greater than the amount of heat removal, and the temperature of the top plate 34 or the support 36 tends to increase over time. The steady state is a state where the amount of heat input and the amount of heat removal from the top plate 34 or the support 36 are equal, the temperature of the top plate 34 or the support 36 does not tend to increase over time, and the temperature is substantially constant.

In the case of the ignition state, the temperature of the top plate 34 increases due to the heat input from the plasma until a steady state is reached. Heat is transmitted from the top plate 34 to the heater 93 via the support 36. As described above, when the temperature of the heater 93 is controlled to be constant, the amount of heat input to the heater 93 and the amount of heat removed from the heater 93 become equal. In the heater 93, the amount of heat required to keep the temperature of the heater 93 constant is reduced. For this reason, the supply power to the heater 93 decreases.

For example, in FIG. 4, in the example of the "transient state," a heat amount of "7" is transmitted from the plasma to the top plate 34. The heat transmitted to the top plate 34 is transmitted to the support 36. Further, when the temperature of the top plate 34 is not in a steady state, a part of the heat transmitted to the top plate 34 acts to increase the temperature of the top plate 34. The amount of heat acting on the temperature rise of the top plate 34 depends on the heat capacity of the top plate 34. Therefore, among the heat amount of "7" transmitted to the top plate 34, the heat amount of "6" is transmitted from the top plate 34 to the surface of the support 36. The heat transmitted to the surface of the support 36 is transmitted to the heater 93. Further, when the temperature of the support 36 is not in a steady state, a part of the heat transmitted to the surface of the support 36 acts to increase the temperature of the support 36. The amount of heat acting on the temperature rise of the top plate 36 depends on the heat capacity of the top plate 36. Therefore, among the heat amount of "6" transmitted to the surface of the support 36, the heat amount of "5" is transmitted to the heater 93. For this reason, when the temperature of the heater 93 is controlled to be constant, the heater 93 is supplied with a heat amount of "5" by the heater power $P_h$ from the second heater power supply HP2.

Further, in FIG. 4, in the example of the "steady state," the heat amount of "7" is transmitted from the plasma to the top plate 34. The heat transmitted to the top plate 34 is transmitted to the support 36. When the temperature of the top plate 34 is in a steady state, the top plate 34 is in a state where the amount of heat input and the amount of heat output are equal. Therefore, the amount of heat of "7" transmitted from the plasma to the top plate 34 is transmitted from the top plate 34 to the surface of the support 36. The heat transmitted to the surface of the support 36 is transmitted to the heater 93. When the temperature of the support 36 is in a steady state, the support 36 is in a state where the amount of heat input and the amount of heat output are equal. Therefore, the heat amount of "7" transmitted to the surface of the support 36 is transmitted to the heater 93. For this reason, when the temperature of the heater 93 is controlled to be constant, the heater 93 is supplied with the heat amount of "3" by the heater power $P_h$ from the second heater power supply HP2.

Figure 5:
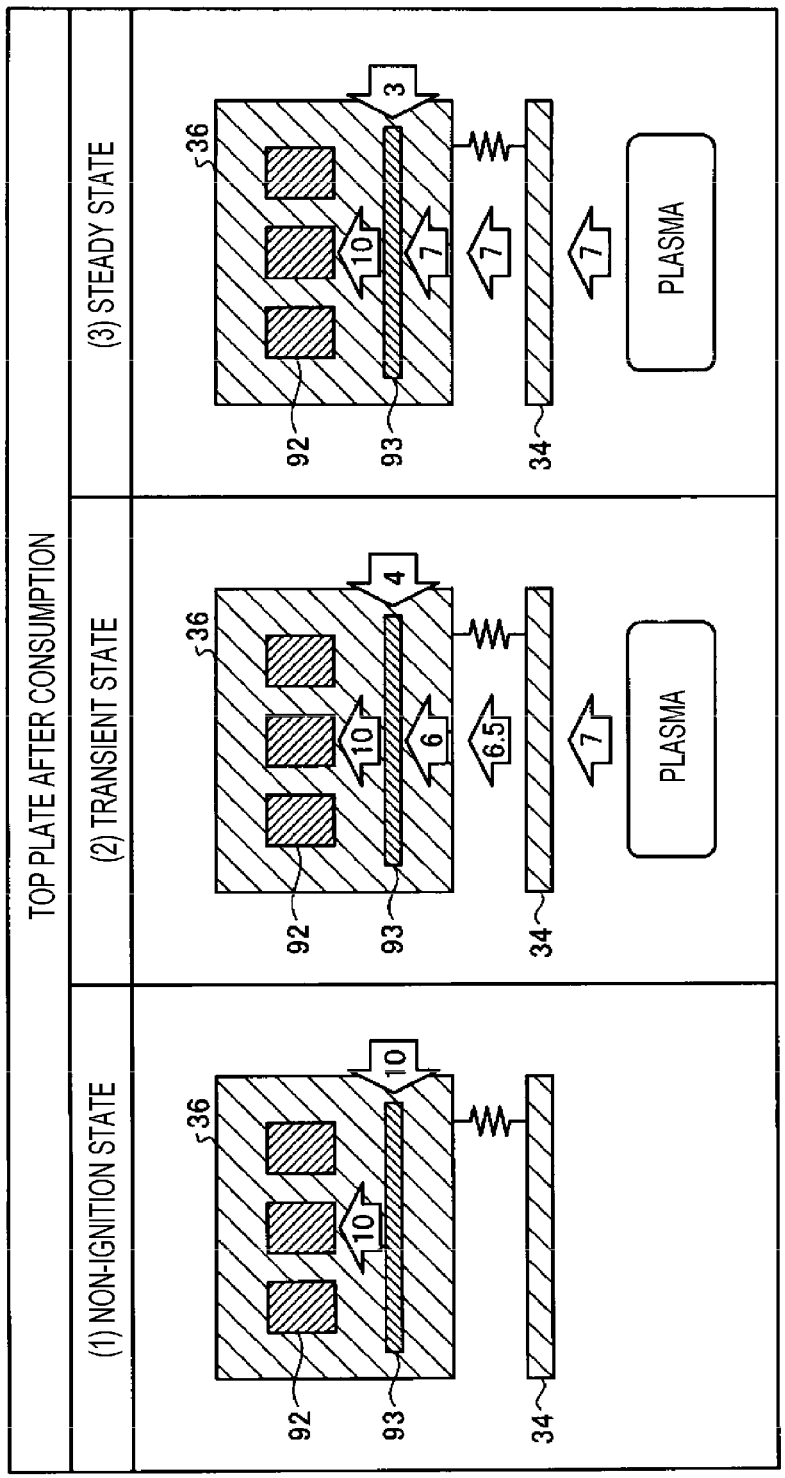
FIG. 5 is a diagram schematically illustrating a flow of energy of a top plate after consumption.

FIG. 5 is a diagram schematically illustrating a flow of energy of the top plate 34 after consumption. The top plate 34 becomes thinner than that in FIG. 4 due to consumption.

In the non-ignition state, even when the top plate 34 is consumed and the thickness thereof is reduced, the flow of energy becomes equal to that before consumption as illustrated in FIG. 4. In FIG. 5, in the example of the "non-ignition state," the heat amount of "10" is removed from the heater 93 by cooling from the coolant flow path 92. When the temperature of the heater 93 is controlled to be constant, the heater 93 generates a heat amount of "10" from the second heater power supply HP2 by the heater power $P_h$.

Meanwhile, in the ignition state, the heater 93 also receives heat from the plasma via the support 36. When the thickness of the top plate 34 becomes thinner due to consumption, the heating time of the top plate 34 is reduced.

For example, in FIG. 5, in the example of the "transient state," the heat amount of "7" is transmitted from the plasma to the top plate 34. The heat transmitted to the top plate 34 is transmitted to the support 36. Further, when the temperature of the top plate 34 is not in a steady state, a part of the heat transmitted to the top plate 34 acts to increase the temperature of the top plate 34. For example, when the top plate 34 is consumed and the thickness thereof becomes thinner, the heat amount of "6.5" of the heat amount of "7" transmitted to the top plate 34 is transmitted from the top plate 34 to the surface of the support 36. The heat transmitted to the surface of the support 36 is transmitted to the heater 93. Further, when the temperature of the support 36 is not in a steady state, a part of the heat transmitted to the surface of the support 36 acts to increase the temperature of the support 36. The amount of heat acting on the temperature rise of the top plate 36 depends on the heat capacity of the top plate 36. Therefore, among the heat amount of "6.5" transmitted to the surface of the support 36, the heat amount of "6" is transmitted to the heater 93. For this reason, when the temperature of the heater 93 is controlled to be constant, the heater 93 is supplied with the heat amount of "4" by the heater power $P_h$ from the second heater power supply HP2.

Further, in FIG. 5, in the example of the "steady state," the heat amount of "7" is transmitted from the plasma to the top plate 34. The heat transmitted to the top plate 34 is transmitted to the support 36. When the temperature of the top plate 34 is in a steady state, the top plate 34 is in a state where the amount of heat input and the amount of heat output are equal. Therefore, the amount of heat "7" transmitted from the plasma to the top plate 34 is transmitted from the top plate 34 to the surface of the support 36. The heat transmitted to the surface of the support 36 is transmitted to the heater 93. When the temperature of the support 36 is in a steady state, the support 36 is in a state where the amount of heat input and the amount of heat output are equal. Therefore, the heat amount of "7" transmitted to the surface of the support 36 is transmitted to the heater 93. For this reason, when the temperature of the heater 93 is controlled to be constant, the heater 93 is supplied with the heat amount of "3" by the heater power $P_h$ from the second heater power supply HP2.

As illustrated in FIGS. 4 and 5, the supply power to the heater 93 is lower in the ignition state than in the non-ignition state. Further, in the ignition state, the supply power to the heater 93 decreases until a steady state is reached. In the transient state, even when the amount of heat input from the plasma is the same, the supply power to the heater 93 varies according to the thickness of the top plate 34.

As illustrated in FIGS. 4 and 5, when the temperature of the heater 93 is controlled to be constant, the heat amount of "10" is removed from the heater 93 by cooling from the base 20 in any of the "non-ignition state," "transient state," and "steady state." That is, the heat flux $q_h$ per unit area from the heater 93 toward the coolant supplied to the coolant flow path 92 formed inside the support 36 is always constant, and the temperature gradient from the heater 93 to the coolant is always constant. Therefore, the temperature sensor used to control the temperature of the heater 93 to be constant need not necessarily be directly attached to the heater 93. For example, when it is between a heater HT and the coolant, a temperature difference between the heater HT and the temperature sensor is always constant. By calculating a temperature difference ($\Delta T$) between the temperature sensor and the heater HT using the thermal conductivity and the thermal resistance of the material between the heater HT and the temperature sensor, and adding the temperature difference ($\Delta T$) to the value of the temperature detected by the temperature sensor, it is possible to output the temperature as the temperature of the heater HT. It is also possible to perform a control in order to keep the actual temperature of the heater HT constant.

Figure 6:
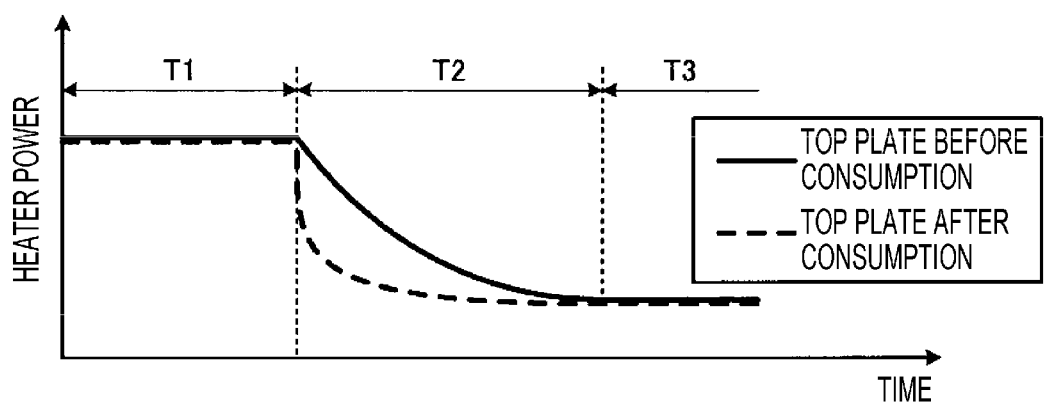
FIG. 6 is a diagram illustrating an example of changes in the temperature of a top plate and a supply power to a heater.

FIG. 6 is a diagram illustrating an example of changes in the temperature of the top plate and the supply power to the heater. FIG. 6 illustrates an example of a result of controlling the temperature of the heater 93 to be constant, igniting a plasma from a non-ignition state where the plasma is not ignited, and measuring the temperature of the top plate 34 and the supply power to the heater 93. The solid line in FIG.

6 represents a change in the supply power to the heater 93 in the case of a new (pre-consumed) top plate 34. The dashed line in FIG. 6 indicates a change in the supply power to the heater 93 in the case of the consumed top plate 34 whose thickness becomes thinner than when the top plate 34 is new.

A period T1 in FIG. 6 refers to a non-ignition state where the plasma is not ignited. In the period T1, the supply power to the heater 93 is constant. A period T2 in FIG. 6 refers to an ignition state where the plasma is ignited and is in a transient state. In the period T2, the supply power to the heater 93 decreases. In the period T2, the temperature of the top plate 34 rises to a certain temperature. A period T3 in FIG. 6 refers to an ignition state where the plasma is ignited. In the period T3, the temperature of the top plate 34 is constant and is in a steady state. When the support 36 is also in the steady state, the supply power to the heater 93 becomes substantially constant, and the fluctuation in the tendency to decrease is stabilized.

The tendency of the decrease in the supply power to the heater 93 in the transient state illustrated in the period T2 of FIG. 6 varies according to the amount of heat input from the plasma to the top plate 34, the thermal resistance between the top plate 34 and the surface of the support 36, and the thickness of the top plate 34.

As described above, when the temperature of the heater 93 is controlled to be constant, the heater power $P_h$ varies according to the amount of heat input from the plasma to the top plate 34, the thermal resistance between the top plate 34 and the surface of the support 36, and the thickness of the top plate 34. Therefore, the graph of the supply power to the heater 93 during the period T2 illustrated in FIG. 6 may be modeled using the amount of heat input from the plasma to the top plate 34, the thermal resistance between the top plate 34 and the surface of the support 36, and the thickness of the top plate 34 as parameters. That is, the change in the supply power to the heater 93 during the period T2 may be modeled by an arithmetic expression using the amount of heat input from the plasma to the top plate 34, the thermal resistance between the top plate 34 and the surface of the support 36, and the thickness of the top plate 34 as parameters.

In the present embodiment, the change in the supply power to the heater 93 during the period T2 in FIG. 6 is modeled as an expression per unit area. For example, the time elapsed since ignition of the plasma is denoted by "t," the heater power $P_h$ at the elapsed time t is denoted by "$P_{h(t)}$," and the amount of heat generated $q_h$ from the heater 93 per unit area when there is a heat flux from the plasma at the elapsed time t is denoted by "$q_{h(t)}$." In this case, the amount of heat generated $q_{h(t)}$ from the heater 93 per unit area when there is a heat flux from the plasma at the elapsed time t may be expressed by the following equation (2). Further, the amount of heat generated $q_{h\_off}$ from the heater 93 per unit area in a steady state when the plasma is not ignited and there is no heat flux from the plasma may be expressed by the following equation (3). The thermal resistance $R_{thc}$·A per unit area between the support surface of the support 36 supporting the top plate 34 and the heater 93 may be expressed by the following equation (4). The heat flux $q_p$ changes depending on whether the plasma is generated. The heat flux $q_p$ per unit area from the plasma to the wafer W when the plasma is generated is denoted by a heat flux $q_{p\_on}$. The heat flux $q_{p\_on}$ per unit area from the plasma to the top plate 34 and the thermal resistance $R_{th}$·A per unit area between the heater 93 and the support surface of the support 36 supporting the top plate 34 are used as parameters to express $a_1$, $a_2$, $a_3$, $\lambda_1$, $\lambda_2$, $\tau_1$, and $\tau_2$ as in the following equations (5) to (11). In this case, the amount of heat generated $q_{h(t)}$ from the heater 93 per unit area when there is a heat flux from the plasma may be expressed by the following equation (1).

$$q_{h(t)} = q_{h\_off} - q_{P\_on} - \frac{R_{th} \cdot A \cdot q_{P\_on}}{R_{thc} \cdot A \cdot (\lambda_1 - \lambda_2)} \left\{ \left(1 + \frac{a_2 + a_3}{a_1 \cdot a_3} \cdot \lambda_2\right)(2a_1 + 3\lambda_1)\exp\left(-\frac{t}{\tau_1}\right) - \left(1 + \frac{a_2 + a_3}{a_1 \cdot a_3} \cdot \lambda_1\right)(2a_1 + 3\lambda_2)\exp\left(-\frac{t}{\tau_2}\right) \right\} \tag{1}$$

$$q_{h(t)} = \frac{P_{b(t)}}{A} \tag{2}$$

$$q_{h\_off} = \frac{P_{h\_off}}{A} \tag{3}$$

$$R_{thc} \cdot A = \frac{z_c}{\kappa_c} \tag{4}$$

$$a_1 = \frac{1}{\rho_{UL} \cdot C_{UL} \cdot z_{UL} \cdot R_{th} \cdot A} \tag{5}$$

$$a_2 = \frac{2}{\rho_c \cdot C_c \cdot z_c \cdot R_{th} \cdot A} \tag{6}$$

$$a_3 = \frac{2}{\rho_c \cdot C_c \cdot z_c \cdot R_{thc} \cdot A} \tag{7}$$

$$\lambda_1 = \frac{1}{2}\left\{-(a_1 + 2a_2 + 2a_3) + \sqrt{(a_1 + 2a_2 + 2a_3)^2 - 8a_1 a_3}\right\} \tag{8}$$

$$\lambda_2 = \frac{1}{2}\left\{-(a_1 + 2a_2 + 2a_3) - \sqrt{(a_1 + 2a_2 + 2a_3)^2 - 8a_1 a_3}\right\} \tag{9}$$

$$\tau_1 = -\frac{1}{\lambda_1} \tag{10}$$

$$\tau_2 = -\frac{1}{\lambda_2} \tag{11}$$

Here, the symbol "$P_{h(t)}$" refers to the heater power [W] when there is a heat flux from the plasma at the elapsed time t.

The symbol "$P_{h\_off}$" refers to a heater power [W/m²] in a steady state when there is no heat flux from the plasma.

The symbol "$q_{h(t)}$" refers to an amount of heat generated [W/m²] from the heater 93 per unit area when there is a heat flux from the plasma at the elapsed time t.

The symbol "$q_{h\_off}$" refers to an amount of heat generated [W/m²] from the heater 93 per unit area in a steady state when there is no heat flux from the plasma.

The symbol "$R_{th}$·A" refers to a thermal resistance [K·m²/W] per unit area between the top plate 34 and the support surface of the support 36 that supports the top plate 34.

The symbol "$R_{th}$·A" refers to a thermal resistance [K·m²/W] per unit area between the heater 93 and the support surface of the support 36 that supports the top plate 34.

The symbol "A" refers to an area [m²] of the region where the heater 93 is provided.

The symbol "$\rho_{UL}$" refers to a density [kg/m³] of the top plate 34.

The symbol "$C_{UL}$" refers to a heat capacity [J/K·m²] per unit area of the top plate 34.

The symbol "$z_{UL}$" refers to a thickness [m] of the top plate 34.

The symbol "$\rho_C$" refers to a density [kg/m³] of the support 36.

The symbol "$C_C$" refers to a heat capacity [J/K·m²] per unit area of the support 36.

The symbol "$z_c$" refers to a distance [m] from the support surface of the support 36 that supports the top plate 34 to the heater 93.

The symbol "$\kappa_c$" refers to a thermal conductivity [W/K·m] of the support 36.

The symbol "t" refers to an elapsed time [sec] since the plasma has been ignited.

With respect to the symbol "$a_1$" represented in the equation (5), $1/a_1$ is a time constant indicating the difficulty of warming the top plate 34. With respect to the symbol "$a_2$" represented in the equation (6), $1/a_2$ is a time constant indicating the difficulty of heat penetration of the support 36 and the difficulty of warming. In addition, with respect to the symbol "$a_3$" represented in the equation (7), $1/a_3$ is a time constant indicating the difficulty of heat penetration of the support 36 and the difficulty of warming.

The density $\rho_{UL}$ of the top plate 34 and the heat capacity $C_{UL}$ per unit area of the top plate 34 are determined in advance from an actual configuration of the top plate 34. The density $\rho_C$ of the support 36, the heat capacity $C_C$ per unit area of the support 36, and the heat conduction $\kappa_c$ of the support 36 are determined in advance from an actual configuration of the support 36. The distance $z_c$ from the support surface of the support 36 supporting the top plate 34 to the heater 93 and the area A of the region where the heater 93 is provided are determined in advance from an actual configuration of the plasma processing apparatus 10. $R_{th} \cdot A$ is determined in advance by the equation (4) from the heat conduction $\kappa_c$ and the distance $z_c$.

The thickness $z_{UL}$ of the top plate 34 is determined to be a specific value in the case of a new top plate 34 but changes by consumption due to etching. Therefore, when the top plate 34 is consumed, the thickness $z_{UL}$ of the top plate 34 also becomes a parameter.

The plasma processing apparatus 10 may perform a plasma processing using various process recipes. The amount of heat input from the plasma to the top plate 34 during the plasma processing and the thermal resistance between the top plate 34 and the surface of the support 36 may be obtained as follows.

For example, the plasma processing apparatus 10 performs a plasma processing by placing a new top plate 34 and measures the heater power $P_h$ of the heater 93 during the plasma processing.

The heater power $P_{h(t)}$ when there is a heat flux from the plasma for each elapsed time t since the ignition of the plasma and the heater power $P_{h\_off}$ in a steady state when there is no heat flux from the plasma may be obtained by a measurement using the plasma processing apparatus 10. Then, as represented in the equation (2), the amount of heat generated $q_{h(t)}$ from the heater 93 per unit area when there is a heat flux from the plasma may be obtained by dividing the obtained heater power Phm by the area A of the heater 93. Further, as represented in the equation (3), the amount of heat generated $q_{h\_off}$ from the heater 93 per unit area in a steady state when there is no heat flux from the plasma may be obtained by dividing the obtained heater power $P_{h\_off}$ by the area A of the heater 93. With respect to the thickness $z_{UL}$ of the top plate 34, in the case of a new top plate 34, the value of the thickness of the new top plate 34 may be used. The thickness of the new top plate 34 may be input from the user interface 103, stored in the storage unit 104, and the value stored in the storage unit 104 may be used. In addition, the thickness of the new top plate 34 may be acquired from a value measured by another measuring device via a network.

The heat flux $q_p$ and the thermal resistance $R_{th} \cdot A$ may be obtained by fitting the measurement results using the above equations (1) to (11) as calculation models.

That is, when the thickness of the top plate 34, such as a new top plate 34, is determined, the plasma processing apparatus 10 may perform a fitting on the equations (1) to (11) using the measurement results, thereby obtaining the heat flux $q_p$ and the thermal resistance $R_{th} \cdot A$.

In the steady state in FIGS. 4 and 5, the heat input from the plasma to the top plate 34 is directly increased as the heat input to the heater 93 from the non-ignition state. Therefore, the amount of heat input from the plasma to the top plate 34 may be calculated from a difference between the supply power in the non-ignition state represented in the period T1 of FIG. 6 and the supply power in the steady state represented in the period T3 thereof. For example, the heat flux $q_p$ may be calculated from the value which is converted per unit area from a difference between the heater power $P_{h\_off}$ when there is no heat flux from the plasma (non-ignition state) and the heater power $P_h$ in a steady state represented in the period T3, as in the following equation (12). Further, the heat flux $q_p$ may be calculated from a difference between the amount of heat generated $q_{h\_off}$ from the heater 93 per unit area and the amount of heat generated $q_h$ from the heater 93 per unit area, as in the following equation (12).

$$q_p = (P_{h\_off} - P_h)/A = q_{h\_off} - q_h \quad (12)$$

The amount of heat input from the plasma to the top plate 34 during the plasma processing and the thermal resistance between the top plate 34 and the surface of the support 36 are determined as described above. The plasma processing apparatus 10 performs the same plasma processing on each of the wafers W that are loaded or unloaded. In this case, the amount of heat input from the plasma to the top plate 34 and the thermal resistance between the top plate 34 and the surface of the support 36 in each plasma processing may be regarded to be the same. When the amount of heat input and the thermal resistance are obtained, the thickness $z_{UL}$ of the top plate 34 may be obtained as follows.

For example, the plasma processing apparatus 10 performs a plasma processing and measures the heater power $P_h$ of the heater 93 during the plasma processing.

The heater power No when there is a heat flux from the plasma for each elapsed time t since the ignition of the plasma and the heater power $P_{h\_off}$ in a steady state when there is no heat flux from the plasma may be obtained from the measurement results of the plasma processing apparatus 10. Then, as represented in the equation (2), the amount of heat generated $q_{h(t)}$ from the heater 93 per unit area when there is a heat flux from the plasma may be obtained by dividing the obtained heater power $P_{h(t)}$ by the area A of the heater 93. Further, as represented in the equation (3), the amount of heat generated $q_{h\_off}$ from the heater 93 per unit area in a steady state when there is no heat flux from the plasma may be obtained by dividing the obtained heater power $P_{h\_off}$ by the area A of the heater 93. The heat flux $q_p$ and the thermal resistance $R_{th} \cdot A$ may be determined by the values obtained by using, for example, a new top plate 34.

Then, the thickness $z_{UL}$ of the top plate 34 may be obtained by fitting the measurement results using the above equations (1) to (11) as calculation models.

That is, when the heat flux $q_p$ and the thermal resistance $R_{th} \cdot A$ are determined, the plasma processing apparatus 10 performs a fitting on the equations (1) to (11) using the measurement results, thereby obtaining the thickness $z_{UL}$ of the top plate 34.

Further, the graph of the temperature of the top plate 34 during the period T2 illustrated in FIG. 6 may also be modeled by using the amount of heat input from the plasma to the top plate 34, the thermal resistance between the top plate 34 and the surface of the support 36, and the thickness of the top plate 34 as parameters. In the present embodiment, the change in the temperature of the top plate 34 during the period T2 is modeled as an expression per unit area. For example, when adopting the heat flux $q_p$, the thermal resistance $R_{th} \cdot A$, and the thickness $z_{UL}$ as parameters and using $a_1$, $a_2$, $a_3$, $\lambda_1$, $\lambda_2$, $T_1$, and $T_2$ represented in the equations (5) to (11), the temperature $T_{UL(t)}$ of the top plate 34 at the elapsed time t may be expressed by the following equation (13).

$$T_{UL(t)} = T_b - q_{p\_on} \cdot (R_{th} \cdot A + R_{thc} \cdot A) + \frac{q_{p\_on}}{\rho_{UL} \cdot C_{UL} \cdot z_{UL} \cdot (\lambda_1 - \lambda_2)} \left\{ \left(1 + \frac{a_2 + a_3}{a_1 \cdot a_3} \cdot \lambda_2\right) \exp\left(-\frac{t}{\tau_1}\right) - \left(1 + \frac{a_2 + a_3}{a_1 \cdot a_3} \cdot \lambda_1\right) \exp\left(-\frac{t}{\tau_2}\right) \right\} \quad (13)$$

Here, the symbol "$T_{UL(t)}$" refers to a temperature [° C.] of the top plate 34 at the elapsed time t.

The symbol "$T_h$" refers to a temperature [° C.] of the heater 93 controlled to be constant.

The temperature $T_h$ of the heater 93 may be obtained from the conditions when the temperature of the top plate 34 is actually controlled to be constant.

When the heat flux $q_p$, the thermal resistance $R_{th} \cdot A$, and the thickness $z_{UL}$ are determined, the temperature $T_{UL(t)}$ of the top plate 34 may be calculated from the equation (13).

When the elapsed time t is sufficiently longer than the time constants $\tau_1$ and $\tau_2$ represented in the equations (10) and (11), the equation (13) may be omitted as in the following equation (14). That is, when calculating the temperature $T_h$ of the heater 93 at which the temperature $T_{UL(t)}$ of the top plate 34 becomes the target temperature after the transition to a steady state which is the period T3 in FIG. 6, the equation (13) may be expressed as in the equation (14).

$$T_{UL(t)} = T_h + q_{p\_on} \cdot (R_{th} \cdot A + R_{thc} \cdot A) \quad (14)$$

For example, the temperature $T_{UL(t)}$ of the top plate 34 may be obtained from the temperature $T_h$ of the heater 93, the heat flux $q_p$, the thermal resistances $R_{th} \cdot A$ and $R_{thc} \cdot A$ by the equation (14).

FIG. 2 is referred to again. A heater controller 102a controls the temperature of the heater 93. For example, the heater controller 102a outputs control data instructing the supply power to the heater 93 to the second heater power supply HP2 and controls the supply power from the second heater power supply HP2 to the heater 93, thereby controlling the temperature of the heater 93.

At the time of the plasma processing, a target set temperature of the heater 93 is set in the heater controller 102a. The target temperature is, for example, a temperature at which the accuracy of the plasma etching is the best.

The heater controller 102a controls the supply power to the heater 93 during the plasma processing so that the heater 93 has a set temperature. For example, the heater controller 102a compares the temperature of the region where the heater 93 indicated by the temperature data input to the external interface 101 is arranged with the set temperature. Based on the comparison result, the heater controller 102a outputs, to the second heater power supply HP2, control data to increase the supply power to the heater 93 when the temperature is lower than the set temperature and decrease the supply power to the heater 93 when the temperature is higher than the set temperature.

The measurement unit 102b measures the supply power to the heater 93. In the present embodiment, the measurement unit 102b measures the supply power to the heater 93 using the supply power to the heater 93 indicated by the power data input to the external interface 101. For example, the measurement unit 102b performs the plasma processing in a state where the supply power to the heater 93 is controlled by the heater controller 102a so that the temperature of the heater 93 becomes constant and measures the supply power to the heater 93. For example, the measurement unit 102b measures the supply power to the heater 93 when the plasma before the start of the plasma processing has not been ignited. In addition, the measurement unit 102b measures the supply power to the heater 93 in a transient state after the plasma is ignited until the fluctuation in the tendency of the supply power to the heater 93 to decrease is stabilized. Further, after the plasma is ignited, the measurement unit 102b measures the supply power to the heater 93 in a stabilized steady state without a decrease in the supply power to the heater 93. At least one supply power to the heater 93 may be measured in the non-ignition state, and the supply powers may be measured a plurality of times and an average value thereof may be used as the supply power in the non-ignition state. The supply power to the heater 93 in the transient state and the steady state may be measured twice or more. The measurement timing for measuring the supply power may include a timing at which the supply power tends to decrease. In addition, when the number of times of measurement is small, the measurement timing may be separated by a predetermined period or more. In the present embodiment, the measurement unit 102b measures the supply power to the heater 93 in a predetermined cycle (e.g., a cycle of 0.1 second) during the plasma processing. Thus, many power supplies to the heater 93 in the transient state and the steady state are measured.

The measurement unit 102b measures the supply power to the heater 93 in the non-ignition state and the transient state in a predetermined cycle. For example, when the top plate 34 is replaced and the new top plate 34 and the wafer W that have not been consumed are placed on the stage 16 to perform the plasma processing, the measurement unit 102b measures the supply power to the hater 93 in the non-ignition state and the transient state. Further, when the wafer W is replaced and the replaced wafer W is placed on the stage 16 to perform the plasma processing, the measurement unit 102b measures the supply power to the heater 93 in the non-ignition state and the transient state every time or every predetermined number of times. For example, the parameter calculator 102c also measures the supply power to the heater 93 in the non-ignition state and the transient state for each plasma processing.

When the new top plate 34 is placed on the stage 16 and the plasma processing is performed, the parameter calculator 102c uses the supply power in the non-ignition state and the transient state measured by the measurement unit 102b, thereby calculating the amount of heat input and the thermal resistance.

First, the parameter calculator 102c calculates the amount of heat generated by the heater 93 that maintains the temperature at a predetermined temperature in a non-ignition state. For example, the parameter calculator 102c calculates the heater power $P_{h\_off}$ in the non-ignition state from the supply power to the heater 93 in the non-ignition state.

Then, the parameter calculator 102c calculates the thermal resistance between the top plate 34 and the stage 16 and the amount of heat input from the plasma into the stage 16 in the ignition state. For example, the parameter calculator 102c performs a fitting that uses the supply power in a non-ignition state and a transition state with respect to a calculation model that calculates the supply power in the transient state using the amount of heat input and the thermal resistance as parameters, thereby calculating the amount of heat input and the thermal resistance.

For example, the parameter calculator 102c calculates the heater power $P_{h\_off}$ of the heater 93 in the non-ignition state for each elapsed time t. In addition, the parameter calculator 102c calculates the heater power $P_{h(t)}$ of the heater 93 in the transient state for each elapsed time t. The parameter calculator 102c obtains the amount of heat generated $q_{h\_off}$ from the heater 93 per unit area in the non-ignition state for each elapsed time t by dividing the obtained heater power $P_{h\_off}$ by the area A of the heater 93. Further, the parameter calculator 102c obtains the amount of heat generated $q_{h(t)}$ from the heater 93 per unit area in a transient state for each elapsed time t by dividing the obtained heater power $P_{h(t)}$ by the area A of the heater 93.

Then, the parameter calculator 102c performs a fitting on the amount of heat generated $q_{h(t)}$ and the the amount of heat generated $q_{h\_off}$ for each elapsed time t using the above equations (1) to (11) as calculation models, thereby calculating the heat flux $q_p$ and the thermal resistance $R_{th} \cdot A$ that minimize the error. As for the thickness $z_{UL}$ of the top plate 34, the value of the thickness of the new top plate 34 is used.

In addition, the parameter calculator 102c may calculate the amount of heat input from the plasma to the wafer W from a difference between the supply power in the non-ignition state and the supply power in the steady state. For example, the parameter calculator 102c may calculate the heat flux $q_p$ by dividing a difference between the heater power $P_{h\_off}$ in the non-ignition state and the heater power $P_h$ in the steady state by the area A of the heater 93 based on the equation (12).

Further, when the heat flux $q_p$ and the thermal resistance $R_{th} \cdot A$ are known in advance by experiments or other methods during the plasma processing in the plasma processing apparatus 10, the heat flux $q_p$ and the thermal resistance $R_{th} \cdot A$ may not be calculated.

Next, when the wafer W is replaced and the replaced wafer W is placed on the stage 16 to perform the plasma processing, the parameter calculator 102c uses the supply power in the non-ignition state and the transient state measured by the measurement unit 102b, thereby calculating the thickness $z_{UL}$ of the top plate 34.

First, the parameter calculator 102c calculates the amount of heat generated by the heater 93 that maintains the temperature at a predetermined temperature in the non-ignition state. For example, the parameter calculator 102c calculates the heater power $P_{h\_off}$ in the non-ignition state from the supply power to the heater 93 in the non-ignition state.

Then, the parameter calculator 102c calculates the thickness $z_{UL}$ of the top plate 34. For example, the parameter calculator 102c performs a fitting that uses the supply power in a non-ignition state and a transition state with respect to a calculation model that calculates the supply power in the transient state using the thickness $z_{UL}$ of the top plate 34 as a parameter, thereby calculating the thickness $z_{UL}$ of the top plate 34.

For example, the parameter calculator 102c calculates the heater power $P_{h\_off}$ of the heater 93 in the non-ignition state for each elapsed time t. In addition, the parameter calculator 102c obtains the heater power $P_{h(t)}$ of the heater 93 in the transient state for each elapsed time t. The parameter calculator 102c calculates the amount of heat generated $q_{h\_off}$ from the heater 93 per unit area in the non-ignition state for each elapsed time t by dividing the obtained heater power $P_{h\_off}$ by the area A of the heater 93. Further, the parameter calculator 102c obtains the amount of heat generated $q_{h(t)}$ from the heater 93 per unit area in a transient state for each elapsed time t by dividing the obtained heater power $P_{h(t)}$ by the area A of the heater 93.

Then, the parameter calculator 102c performs a fitting on the thickness $z_{UL}$ of the top plate 34 using the above equations (1) to (11) as calculation models, thereby calculating the thickness $z_{UL}$ of the top plate 34 that minimizes the error. As for the heat flux $q_p$ and the thermal resistance $R_{th} \cdot A$, for example, values obtained by using a new top plate 34 are used. Further, when the heat flux $q_p$ and the thermal resistance $R_{th} \cdot A$ are known in advance by experiments or other methods, the known values of the heat flux $q_p$ and thermal resistance $R_{th} \cdot A$ may be used.

Thus, the plasma processing apparatus 10 according to the present embodiment may obtain the thickness $z_{UL}$ of the consumed top plate 34.

Here, when the plasma processing is continued, the top plate 34 is consumed. For this reason, it is important to grasp the thickness of the top plate 34 in the plasma processing apparatus in a timely manner. However, since the top plate 34 is installed in the processing container 12, it is not possible to directly measure the thickness thereof. Therefore, in the plasma processing apparatus of the related art, a replacement time is determined from past results such as the number of processed wafers W, and the top plate 34 is replaced every replacement time.

However, the plasma processing apparatus may perform a processing with a different process recipe. For this reason, since the plasma processing apparatus needs to use a replacement time with a certain margin in the past results, the productivity of the plasma processing apparatus decreases.

Therefore, for example, it is conceivable to dispose a sensor such as an optical device of measuring a film thickness using an optical fiber in the processing container 12 and measure the thickness of the top plate 34 with the sensor. However, when the sensor is disposed in the processing container 12, the manufacturing cost of the plasma processing apparatus 10 increases. Further, in the plasma processing apparatus 10, when the sensor is disposed in the processing container 12, the sensor becomes a singular point, and the uniformity of the plasma processing is reduced around the singular point. For this reason, in the plasma processing apparatus, it is preferable to obtain the thickness of the top plate 34 without disposing a sensor in the processing container 12.

The plasma processing apparatus 10 according to the present embodiment may obtain the thickness of the top plate 34 without disposing a dedicated sensor that measures the thickness of the top plate 34 in the processing container 12 and obtain a degree of consumption of the top plate 34 from the thickness of the top plate 34. As described above, the plasma processing apparatus 10 according to the present embodiment may obtain the thickness of the top plate 34, and thus may be used as follows. For example, in a system in which a plurality of plasma processing apparatuses 10 are arranged to etch wafers W, a control is performed to increase the number of wafers W to be processed by the plasma processing apparatus 10 in which the consumption amount of the top plate 34 is small, and the maintenance timing of the plasma processing apparatus 10 is adjusted. As a result, the downtime of the maintenance of the entire system may be shortened, and the productivity thereof may be improved.

The set temperature calculator 102d calculates a set temperature of the heater 93 at which the top plate 34 reaches a target temperature, using the calculated amount of heat input, thermal resistance, and thickness $z_{UL}$ of the top plate 34. For example, the set temperature calculator 102d substitutes the calculated heat flux $q_p$, thermal resistance $R_{th} \cdot A$, and thickness $z_{UL}$ of the top plate 34 into the equations (5), (6), and (12) to obtain $a_1$, $a_2$, $a_3$, $\lambda_1$, $\lambda_2$, $\tau_1$, and $\tau_2$ represented in the equations (5) to (11). Using the obtained $a_1$, $a_2$, $a_3$, $\lambda_1$, $\lambda_2$, $\tau_1$, and $\tau_2$, the set temperature calculator 102d calculates the temperature $T_h$ of the heater 93 at which the temperature Tout) of the top plate 34 becomes the target temperature from the equation (12). For example, the set temperature calculator 102d calculates the temperature $T_h$ of the heater 93 at which the temperature $T_{UL(t)}$ of the top plate 34 becomes the target temperature as a predetermined value that is large enough to consider the elapsed time t as a steady state. The calculated temperature $T_h$ of the heater 93 is the temperature of the heater 93 at which the temperature of the top plate 34 becomes the target temperature. Further, the temperature $T_h$ of the heater 93 at which the temperature of the top plate 34 becomes the target temperature may be obtained from the equation (13).

The set temperature calculator 102d may calculate the temperature $T_{UL(t)}$ of the top plate 34 at the current temperature $T_h$ of the heater 93 from the equation (14). For example, when the elapsed time t is set to a predetermined large value that may be considered as a steady state at the current temperature $T_h$ of the heater 93, the set temperature calculator 102d calculates the temperature $T_{UL(t)}$ of the top plate 34. Next, the set temperature calculator 102d calculates a difference $\Delta T_W$ between the calculated temperature $T_{UL(t)}$ and the target temperature. Then, the set temperature calculator 102d may calculate the temperature obtained by subtracting the difference $\Delta T_W$ from the current temperature $T_h$ of the heater 93 as the temperature of the heater 93 at which the temperature of the top plate 34 becomes the target temperature.

The set temperature calculator 102d corrects the set temperature of the heater 93 of the heater controller 102a to a temperature of the heater 93 at which the temperature of the top plate 34 becomes the target temperature.

Thus, the plasma processing apparatus 10 according to the present embodiment may accurately control the temperature of the top plate 34 during the plasma processing to the target temperature.

The alert unit 102e issues an alert based on a change in the thickness $z_{UL}$ of the top plate 34 calculated in a predetermined cycle by the parameter calculator 102c. For example, the alert unit 102e issues an alert when the thickness $z_{UL}$ of the top plate 34 becomes equal to or less than a predetermined specified value indicating a replacement time. The alert may be of any type when the replacement time may be notified to a process manager or a manager of the plasma processing apparatus 10. For example, the alert unit 102e displays a message notifying the replacement time on the user interface 103.

Thus, the plasma processing apparatus 10 according to the present embodiment may notify that the top plate 34 has been consumed and the replacement time has come.

[Flow of Process]

Figure 7:
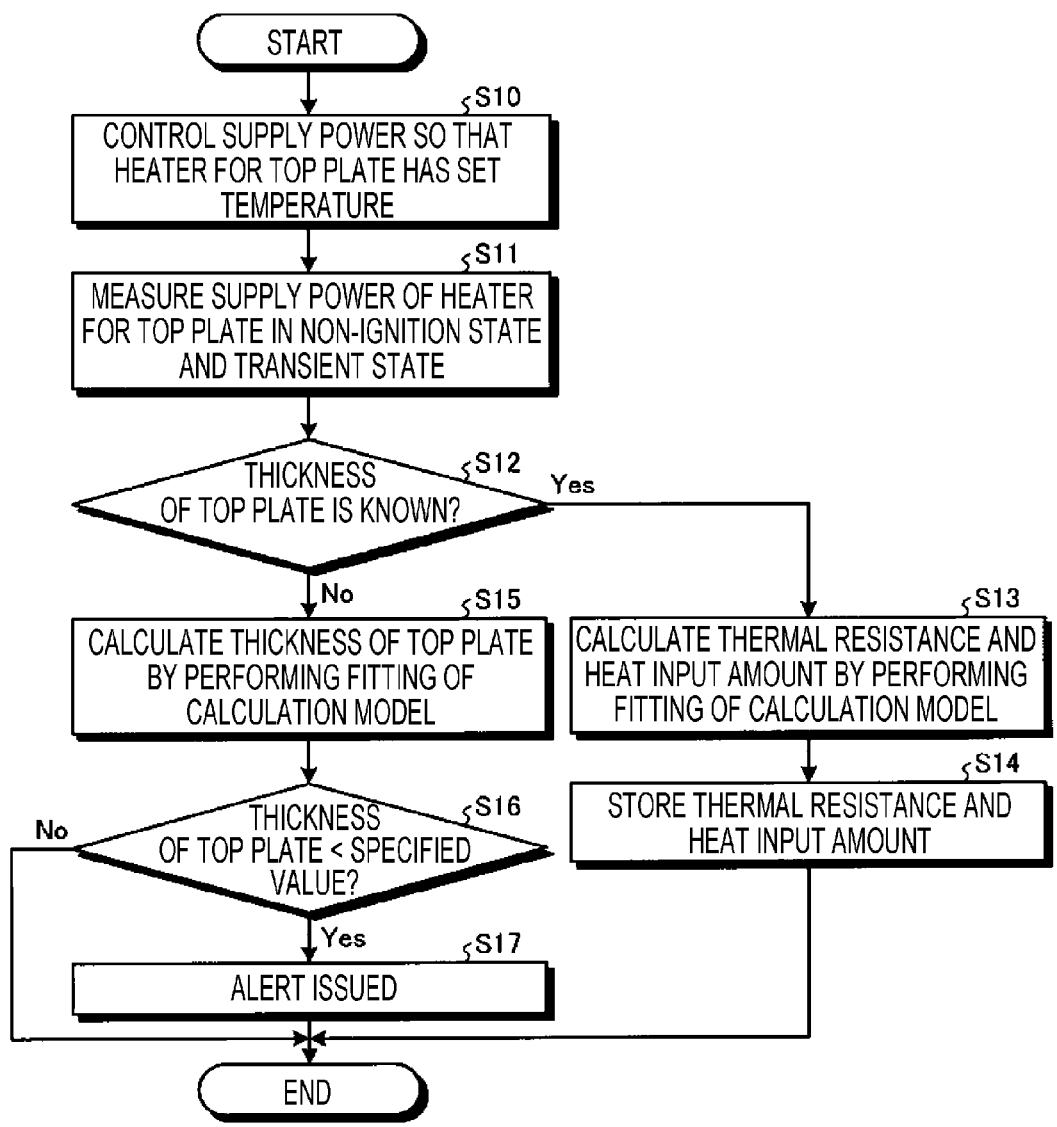
FIG. 7 is a flowchart illustrating an example of a flow of a determination process according to the first embodiment.

Next, descriptions will be made on a flow of a determination process that includes a calculation process in which the plasma processing apparatus 10 calculates the thickness of the top plate 34, and determines a replacement time of the top plate 34 from the calculated thickness of the top plate 34. FIG. 7 is a flowchart illustrating an example of a flow of a determination process according to the first embodiment. The determination process is executed at a predetermined timing, for example, at a timing when the plasma processing apparatus 10 starts the plasma processing.

The heater controller 102a controls the supply power to the heater 93 so that the heater 93 has a set temperature (step S10).

The measurement unit 102b measures the supply power to the heater 93 in the non-ignition state and the transient state in a state where the supply power to the heater 93 is controlled by the heater controller 102a so that the temperature of the heater 93 has a fixed set temperature (step S11).

The parameter calculator 102c determines whether the thickness of the top plate 34 is known (step S12). For example, in the case of the first plasma processing after the top plate 34 is replaced, when the top plate 34 is new, it is determined that the design dimensions are known and the thickness of the top plate 34 is known. Further, in the case of replacing the used top plate 34, when the thickness of the top plate 34 is measured in advance with a micrometer before the replacement, the thickness of the top plate 34 is determined to be known. In addition, whether the thickness of the top plate 34 is known is input from the user interface 103, and the parameter calculator 102c may determine whether the thickness of the top plate 34 is known using the input result. For example, the plasma processing apparatus 10 may input the thickness of the top plate 34 from the user interface 103. When the thickness of the top plate 34 is input from the user interface 103, the parameter calculator 102c may determine whether the thickness of the top plate 34 is known. The value of the thickness of the top plate 34 having a known thickness, such as a new top plate 34, may be stored in the storage unit 104, and the thickness of the top plate 34 may be selectively input from the user interface 103.

When it is determined that the thickness of the top plate 34 is known ("Yes" in step S12), the parameter calculator 102c calculates the thermal resistance and the amount of heat input using the supply power in the non-ignition state and the transient state measured by the measurement unit 102b (step S13). For example, the parameter calculator 102c performs a fitting on the amount of heat generated $q_{h(t)}$ and amount of heat generated $q_{h\_off}$ for each elapsed time t using the above equations (1) to (11) as calculation models, thereby calculating the heat flux $q_p$ and the thermal resistance $R_{th} \cdot A$ that minimize the error. As for the thickness $z_{UL}$ of the top plate 34, the known value of the thickness of the top plate 34 is used.

The parameter calculator 102c stores the calculated heat flux $q_p$ and thermal resistance $R_{th} \cdot A$ in the storage unit 104 (step S14) and ends the process.

When it is determined that the thickness of the top plate 34 is not known ("No" in step S12), the parameter calculator 102c calculates the thickness $z_{UL}$ of the top plate 34 using the supply power in the non-ignition state and the transient state measured by the measurement unit 102b (step S15). For example, the parameter calculator 102c performs a fitting on the thickness $z_{UL}$ of the top plate 34 using the above equations (1) to (11) as calculation models, thereby calculating the thickness $z_{UL}$ of the top plate 34 that minimizes the error. As for the heat flux $q_p$ and the thermal resistance $R_{th} \cdot A$, for example, the values stored in the storage unit 104 in step S14 are used.

The alert unit 102e determines whether the thickness $z_{UL}$ of the top plate 34 calculated by the parameter calculator 102c is equal to or less than a predetermined specified value (step S16). When it is determined that the thickness $z_{UL}$ of the top plate 34 is not equal to or less than the predetermined specified value ("No" in step S16), the process ends.

When it is determined that the thickness $z_{UL}$ of the top plate 34 is equal to or less than the predetermined specified value ("Yes" in step S16), the alert unit 102e issues an alert (step S17) and ends the process.

As described above, the plasma processing apparatus 10 according to the present embodiment includes the support 36, the heater controller 102a, the measurement unit 102b, and the parameter calculator 102c. The support 36 detachably supports the top plate 34 facing the plasma and is provided with a heater 93 capable of adjusting the temperature of the support surface of the top plate 34. The heater controller 102a controls the supply power to the heater 93 so that the heater 93 has a set temperature. The measurement unit 102b controls the supply power to the heater by the heater controller 102a so that a temperature of the heater 93 becomes constant, thereby measuring the supply power in a non-ignition state where plasma is not ignited and in a transient state where the supply power to the heater is reduced after the plasma is ignited. The parameter calculator 102c performs a fitting that uses the supply power in a non-ignition state and a transition state measured by the measurement unit 102b with respect to a calculation model that includes the thickness $z_{UL}$ of the top plate 34 as a parameter and calculates the supply power in the transient state, thereby calculating the thickness $z_{UL}$ of the top plate 34. Thus, the plasma processing apparatus 10 may obtain the thickness of the top plate 34 and obtain the degree of consumption of the top plate 34 from the thickness of the top plate 34.

In addition, the measurement unit 102b measures the supply power in the non-ignition state and the transient state in a predetermined cycle. The parameter calculator 102c calculates the thickness $z_{UL}$ of the top plate 34 using the measured supply power in the non-ignition state and the transient state every predetermined cycle. The alert unit 102e issues an alert based on a change in the thickness $z_{UL}$ of the top plate 34 calculated by the parameter calculator 102c. Thus, the plasma processing apparatus 10 may notify that the top plate 34 has been consumed and the replacement time has come.

Second Embodiment

Next, a schematic configuration of the plasma processing apparatus 10 according to a second embodiment will be described. The plasma processing apparatus 10 according to the second embodiment has substantially the same configuration as the plasma processing apparatus 10 according to the first embodiment. Thus, the same portions are denoted by the same reference numerals, descriptions thereof will be omitted, and different portions will be mainly described.

Figure 8:
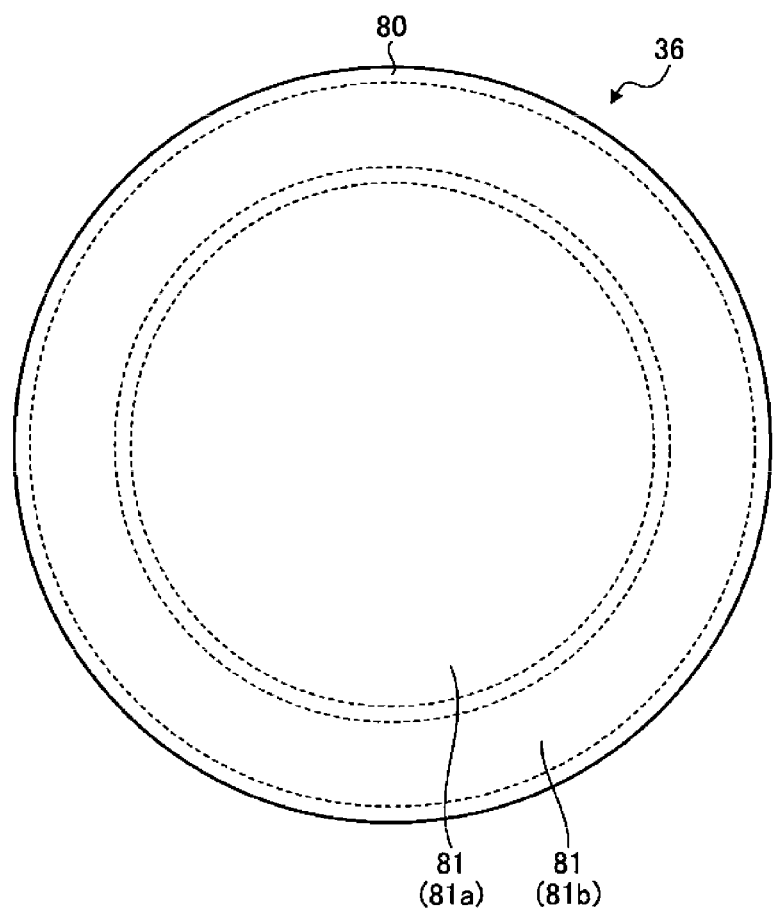
FIG. 8 is a diagram illustrating an example of a divided region obtained by dividing a support surface that supports a top plate of a support according to a second embodiment.

In the plasma processing apparatus 10 according to the second embodiment, the support surface which supports the top plate 34 of the support 36 is divided into a plurality of divided regions, and a heater 93 is provided in each divided region. FIG. 8 is a diagram illustrating an example of a divided region obtained by dividing a support surface that supports the top plate 34 of the support 36 according to the second embodiment. The support 36 has a support surface 80 that supports the top plate 34. The support surface 80 is divided into a plurality of divided regions 75, and a heater 93 is provided in each divided region 81. For example, as illustrated in FIG. 8, the support surface 80 is divided into a central circular divided region 81a and an annular divided region 81b. A heater 93 is provided in each of the divided regions 81a and 81b. Each divided region 81 is provided with a temperature sensor capable of detecting the temperature of the heater 93 (not illustrated). In the present embodiment, a case where the temperature is controlled by dividing the support surface 80 into two divided regions 81a and 75b will be described as an example. However, the number of divided regions 81 is not limited to two and may be three or more. Each heater 93 is individually connected to a second heater power supply HP2 via a wiring (not illustrated). The second heater power supply HP2 supplies the adjusted power to the heater 93 under the control of a controller 100. Thus, the heat generated by each heater 93 is individually controlled.

The heater controller 102a controls the supply power for each heater 93 so that the heater 93 provided for each divided region 81 has a set temperature set for each divided region 81. For example, the heater controller 102a compares the temperature of each divided region 81 of a placement region 18a indicated by the temperature data input to the external interface 101 with the set temperature of the divided region 81 for each divided region 81. The heater controller 102a uses the comparison result to specify the divided region 81 having a lower temperature than the set temperature and the divided region 81 having a higher temperature than the set temperature. The heater controller 102a outputs, to the second heater power supply HP2, control data to increase the supply power to the divided region 81 having a lower temperature than the set temperature and decrease the supply power to the divided region 81 having a higher temperature than the set temperature.

The measurement unit 102b controls the supply power by the heater controller 102a so that the temperature becomes constant for each heater 93 and measures the supply power for each heater 93 in the non-ignition state and the transient state. In the present embodiment, the measurement unit 102b measures the supply power to the heater 93 using the supply power to the heater 93 indicated by the power data input to the external interface 101.

The parameter calculator 102c performs a fitting for each heater 93 on the calculation model using the supply power in the non-ignition state and the transient state measured by the measurement unit 102b, thereby calculating the thickness of the top plate 34 for each heater 93.

As described above, in the plasma processing apparatus 10 according to the present embodiment, the heater 93 is individually provided for each of the divided regions 81 in which the support 36 divides the support surface 80. The heater controller 102a controls the supply power for each heater 93 so that the heater 93 provided for each divided region 81 has the set temperature set for each divided region 81. The measurement unit 102b controls the supply power by the heater controller 102a so that the temperature becomes constant for each heater 93 and measures the supply power for each heater 93 in the non-ignition state and the transient state. The parameter calculator 102c performs a fitting for each heater 93 on the calculation model using the supply power in the non-ignition state and the transient state measured by the measurement unit 102b, thereby calculating the thickness of the top plate 34 for each heater 93. Thus, the plasma processing apparatus 10 according to the present embodiment may obtain the thickness of the top plate 34 for each divided region 81 and obtain the degree of consumption of the top plate 81 for each divided region 81.

For example, although the above-described plasma processing apparatus 10 is a capacitively-coupled plasma processing apparatus 10, such an apparatus 10 may be employed in any plasma processing apparatus 10. For example, the plasma processing apparatus 10 may be any type of plasma processing apparatus 10, such as an inductively coupled plasma processing apparatus 10 or a plasma processing apparatus 10 that excites a gas with a surface wave such as a microwave.

Further, in the above embodiment, the case where the top plate 34 is a part of the shower head 30 and many gas holes 34a for ejecting gas are formed has been described as an example, but the present disclosure is not limited thereto. The top plate 34 may have a gas hole 34a that ejects a gas at the center, and the other portion may be formed in a flat plate shape without the gas hole 34a. Further, the gas may be supplied from the side surface of the processing container 12, and the top plate 34 may be formed in a flat plate shape without the gas holes 34a. Further, the top plate 34 may be configured such that the surface on the plasma side is divided into a plurality of surfaces. In addition, in the plasma processing apparatus 10, a ring member may be disposed around the shower head 30 as a top plate in addition to the shower head 30 above the stage 16.

Figure 9:
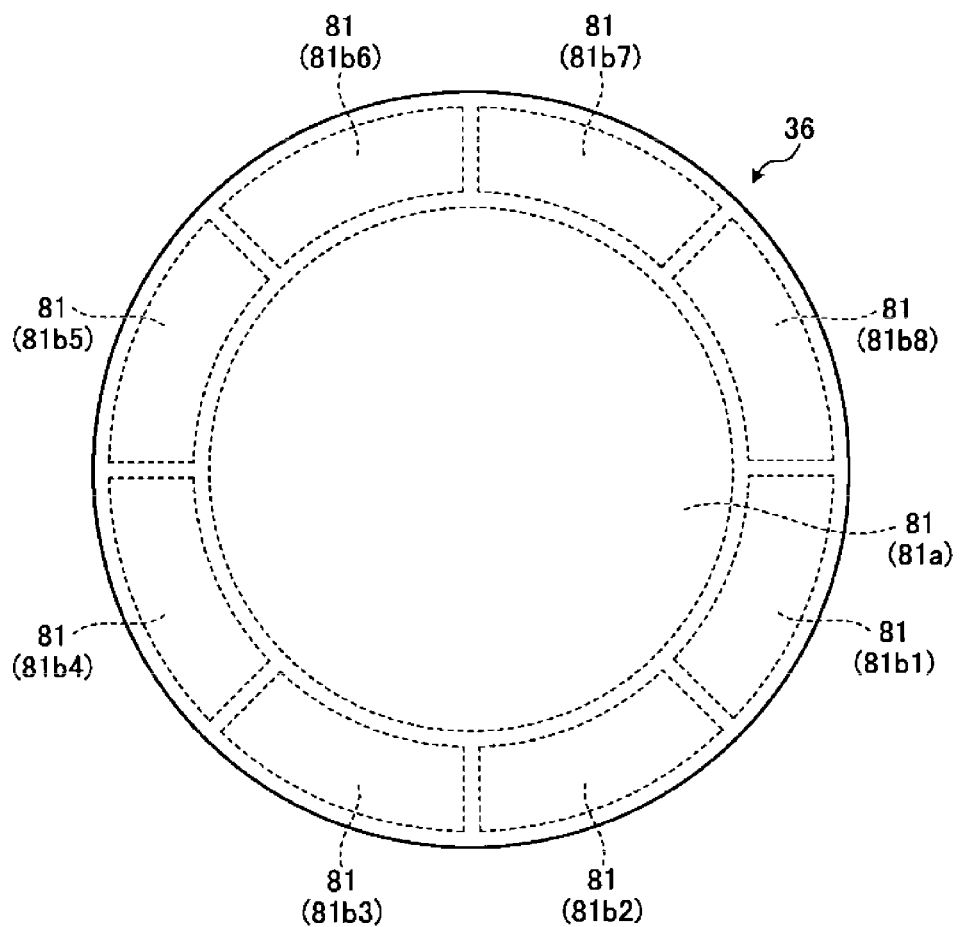
FIG. 9 is a diagram illustrating an example of a divided region obtained by dividing a support surface that supports a top plate of a support according to another embodiment.
Figure 10:
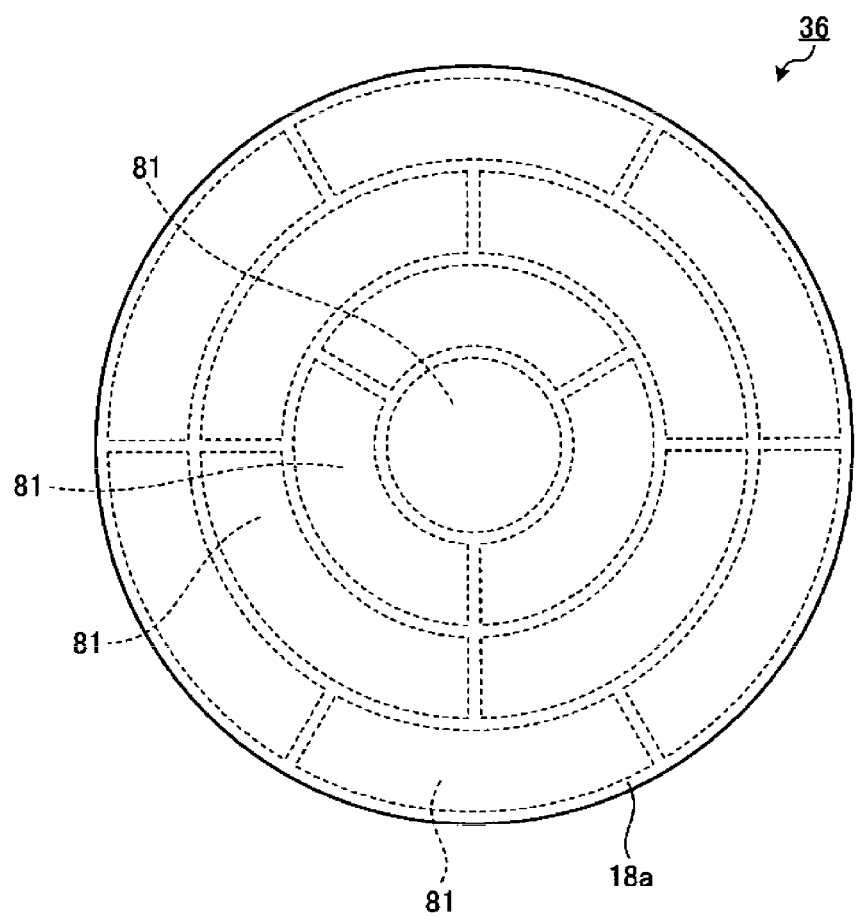
FIG. 10 is a diagram illustrating an example of a divided region obtained by dividing a support surface that supports a top plate of a support according to still another embodiment.

Further, in the above-described second embodiment, as illustrated in FIG. 8, the case where the support surface 80 is divided into two divided regions 81 in the radial direction has been described as an example, but the present disclosure is not limited thereto. For example, the support surface 80 may be divided in the circumferential direction. For example, the divided region 81b may be divided in the circumferential direction. FIG. 9 is a diagram illustrating an example of a divided region obtained by dividing a support surface that supports a top plate of a support according to another embodiment. In FIG. 9, the divided region 81b is divided into eight divided regions 81 (81b1 to 75b8) in the circumferential direction. FIG. 10 is a diagram illustrating an example of a divided region obtained by dividing a support surface that supports a top plate of a support according to still another embodiment. In FIG. 10, the support surface 80 is divided into a central circular divided region 81 and a plurality of concentric annular divided regions surrounding the circular divided region 81. Further, the annular divided region is divided into a plurality of divided regions 81 in the circumferential direction. The heaters 93 are individually provided in the respective divided regions 81. The heater controller 102a controls the supply power for each heater 93 so that the heater 93 provided for each divided region 81 has a set temperature set for each divided region 81. The measurement unit 102b controls the supply power by the heater controller 102a so that the temperature becomes constant for each heater 93 and measures the supply power for each heater 93 in the non-ignition state and the transient state. The parameter calculator 102c performs a fitting for each heater 93 on the calculation model using the supply power in the non-ignition state and the transient state measured by the measurement unit 102b, thereby calculating the thickness $z_{UL}$ of the top plate 34 for each heater 93. Thus, the plasma processing apparatus 10 may obtain the thickness $z_{ULR}$ of the top plate 34 for each divided region 81.

Further, in the above-described embodiment, a case has been described as an example in which a radio-frequency power is applied to the shower head 30 and the stage 16, respectively, to generate a plasma, but the present disclosure is not limited thereto. As for a method of generating a plasma, any method may be used. For example, the plasma may be generated by applying two different radio-frequency powers to the stage 16.

According to the present disclosure, the degree of consumption of the top plate may be obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
    a support configured to detachably support a top plate that faces a plasma and provided with a heater capable of adjusting a temperature of a support surface of the top plate; and
    a controller that controls an overall operation of the plasma processing apparatus and configured to:
        control a supply power to the heater such that the heater has a set temperature;
        measure the supply power to the heater in a non-ignition state where the plasma is not ignited and in a transition state where the supply power to the heater is reduced after the plasma is ignited; and
        calculate a thickness of the top plate by performing a fitting on a calculation model which includes an initial thickness of the top plate as a parameter and calculates a thermal resistance and a heat input amount, using the supply power in the non-ignition state and the transition state.

2. The plasma processing apparatus according to claim 1, wherein the support is provided with a plurality of heaters each provided in each of regions dividing the support surface, and
    the controller is configured to:
        control the supply power for each of the plurality of heaters such that each of the plurality of heaters has a set temperature for each of the regions;
        measure the supply power in the non-ignition state and the transition state for each of the plurality of heaters, while the supply power is controlled such that the set temperature is maintained in each of the plurality of heaters; and
        calculate the thickness of the top plate for each of the plurality of heaters by performing a fitting on the calculation model for each of the plurality of heaters using the supply power in the non-ignition state and the transition state.

3. The plasma processing apparatus according to claim 1, wherein the controller is configured to:
    measure the supply power in the non-ignition state and the transition state in a predetermined cycle;
    calculate the thickness of the top plate using the measured supply power in the non-ignition state and the transition state in the predetermined cycle; and
    issue an alert based on a change in the thickness of the top plate.

4. The plasma processing apparatus according to claim 2, wherein the controller is configured to:
    measure the supply power in the non-ignition state and the transition state in a predetermined cycle;
    calculate the thickness of the top plate using the measured supply power in the non-ignition state and the transition state in the predetermined cycle; and
    issue an alert based on a change in the thickness of the top plate.

5. A calculation method comprising:
    controlling a supply power to a heater provided in a support that detachably supports a top plate facing a plasma and configured to adjust a temperature of a support surface of the top plate, such that the heater is maintained at a set temperature;

measuring a supply power to the heater in a non-ignition state where the plasma is not ignited and in a transition state where the supply power to the heater is reduced after the plasma is ignited; and calculating a thickness of the top plate by performing a fitting on a calculation model which includes an initial thickness of the top plate as a parameter and calculates a thermal resistance and a heat input amount, using the supply power in the non-ignition state and the transition state measured in the measuring.

6. A non-transitory computer-readable recording medium having stored therein a program that causes a computer to execute a calculation process including:

controlling a supply power to a heater provided in a support that detachably support a top plate facing a plasma and configured to adjust a temperature of a support surface of the top plate, such that the heater is maintained at a set temperature;

measuring a supply power to the heater in a non-ignition state where the plasma is not ignited and in a transition state where the supply power to the heater is reduced after the plasma is ignited; and calculating a thickness of the top plate by performing a fitting on a calculation model which includes an initial thickness of the top plate as a parameter and calculates a thermal resistance and a heat input amount, using the supply power in the non-ignition state and the transition state measured in the measuring.

7. The calculation method according to claim 5, further comprising:

measuring the supply power in the non-ignition state and the transition state in a predetermined cycle;

calculating the thickness of the top plate using the measured supply power in the non-ignition state and the transition state in the predetermined cycle; and issuing an alert based on a change in the thickness of the top plate.

8. The plasma processing apparatus according to claim 1, wherein the initial thickness of the top plate is stored in advance.

9. The plasma processing apparatus according to claim 1, wherein the initial thickness of the top plate is input from a user interface.

* * * * *